United States Patent [19]

Guntheroth

[11] Patent Number: 4,876,684
[45] Date of Patent: Oct. 24, 1989

[54] METHOD OF AND APPARATUS FOR DIAGNOSING FAILURES IN READ ONLY MEMORY SYSTEMS AND THE LIKE

[75] Inventor: Kurt Guntheroth, Mukilteo, Wash.

[73] Assignee: John Fluke Mfg. Co., Inc., Everett, Wash.

[21] Appl. No.: 154,927

[22] Filed: Feb. 11, 1988

[51] Int. Cl.$^4$ ............................................. G01R 31/28
[52] U.S. Cl. ..................................................... 371/21.2
[58] Field of Search ........................ 371/21, 60, 67, 15; 365/201

[56] References Cited

U.S. PATENT DOCUMENTS

| | | | |
|---|---|---|---|
| 4,061,908 | 12/1977 | deJonge | 371/21 |
| 4,298,980 | 11/1981 | Hajdu | 371/21 X |
| 4,618,954 | 10/1986 | Otobe | 371/67 X |
| 4,715,034 | 12/1987 | Jacobson | 371/21 |
| 4,782,486 | 11/1988 | Lipcon | 371/21 |

Primary Examiner—Jerry Smith
Assistant Examiner—Robert W. Beausoliel
Attorney, Agent, or Firm—George T. Noe; Stephen A. Becker

[57] ABSTRACT

A semiconductor memory such as a read only memory (ROM) is tested and faults are diagnosed and identified by examining data stored therein for patterns that could not exist if the memory is faulty, proving the memory to be functional by counterexample. Diagnosis is carried out using probabilistic algorithms that terminate quickly if the memory is not faulty, with any pathological contents of the memory masked to minimize the likelihood of misdiagnosis. Faults diagnosed in accordance with the invention include stuck or tied data or address lines.

15 Claims, 7 Drawing Sheets

TEST FOR TIED DATA LINES

DATAWORD | W-1 | W-2 | ---- | j | ---- | i | ---- | 2 | 1 | 0 |

IF BIT i AND BIT j ARE TIED, THEN EVERY TIME i=1,
j WILL EQUAL 1 AND EVERY TIME i=0, j=0.

Fig. 6

TWO ADDRESS LINES DIVIDE THE ROM INTO 4 REGIONS.
IF THE ADDRESS LINES ARE TIED, REGION 1 & 2 WILL CONTAIN THE SAME DATA.

|   | 0 | 1 |
|---|---|---|
| 0 | REGION 0 | REGION 1 |
| 1 | REGION 2 | REGION 3 |

Fig. 7(a)

NORMALLY IT IS NOT EXPECTED THAT THE ROM WILL CONTAIN THE SAME DATA IN THESE FOUR REGIONS.

Fig. 7(b)

INVERTERS:
IF ONE OF THE ADDRESS LINES IS INVERTED, MUST CHECK THE OTHER DIAGONAL.
IF BOTH LINES ARE INVERTED, BACK TO THE ORIGINAL CASE.

Fig. 7(c)

METHOD OF AND APPARATUS FOR DIAGNOSING FAILURES IN READ ONLY MEMORY SYSTEMS AND THE LIKE

TECHNICAL FIELD

This invention relates generally toward methods of and systems for diagnosing faults in semiconductor memories, and more particularly, toward novel probabilistic algorithm implementations for diagnosing and identifying faults in memories such as read only memories (ROMs) having data prestored therein and other memories wherein the data may not be altered for testing.

BACKGROUND ART

Digital circuitry involving microprocessor or other programmed apparatus based circuitry generally includes two different types of semiconductor memory devices, viz., random access memory (RAM) devices which store data that are changeable during the normal course of information processing and read only memory (ROM) devices which contain programing and data that are constant during processing. Within these general classifications of memory devices are included non-volatile RAMs which retain data stored therein upon removal of electrical power from the devices, and programmable ROMs which contain programming and data that can be electrically or electrooptically altered.

Physical faults, which can occur in any part of the chips forming the memory devices as well as on printed wiring boards connecting the chips into systems, depend on such factors as component density, circuit layout and method of manufacture. Test procedures necessary to detect these faults are classified into three classes, DC parametric testing, AC parametric testing and functional testing. For a detailed description of each classification as it relates to testing of random access memories, attention is directed toward U.S. Patent Application Ser. No. 708,749 of Jacobson, filed on Mar. 4, 1985, assigned to the assignee of this invention and incorporated herein by reference.

A complete functional verification of the correct function of a read only memory (ROM) circuit in a system involves checking that each of the N words of the ROM contains the data originally programmed into it, and that the order in which cells are accessed has no effect on the values read. Complete verification is infeasible, requiring $2^N$ accesses to test an N word ROM. Even sequentially verifying that each locations contains the data programmed into it may not be possible if the original data are not available or the ROM is large.

Functional testing of a ROM is considered to be more difficult to implement than functional testing of a RAM because the data stored in a ROM is predetermined, i.e., patterns of data that are truly random or otherwise suited well for testing the memory are not able to be written therein during testing or the prestored data may contain "pathological" data peculiar to the use to which the ROM is put and which conceals a fault.

In current practice, to test the function of an ROM, data stored therein are compressed into either a checksum or a cyclic redundancy check (CRC) word. This "signature" of the ROM data is compared against a similar signature calculated from the data originally programmed into the ROM. If the signatures are equal, the data are presumed identical.

The ROM signature is not completely effective in encoding the ROM data. Although two ROMs which differ in a single bit position will always have different checksums or CRC signatures, the probability that two ROMs which differ in many positions will have the same signature is at least $2^{-b}$, wherein b is the width of the signature in bits. That value is 1/256 for most checksums, and 1/65536 for CRC16 signatures. This is significant because a fault in ROM accessing circuitry affects data in many locations, increasing the chance that the signature of the faulty ROM circuit will match the original signature. Even if the ROM signature differs from the signature of the original data, it provides a pass or fail indication but no diagnostic information indicating the type or source of the fault. Thus, diagnosing faults in ROM circuits or other memory circuits such as non-volatile RAMs upon restoration of power having data prestored therein that cannot be replaced with test data or otherwise altered, has not been effectively carried out; instead, each wire leading to a suspect device has had to be examined manually for shorts or opens.

DISCLOSURE OF THE INVENTION

Accordingly, one object of the invention is to provide testing and diagnosis of read only memory devices and systems and of other memory devices and systems having programming or unalterable data stored therein.

A further object is to provide testing and diagnosis of such memory devices and systems using probabilistic algorithms of a class which terminate quickly when no faults are found.

An additional object is to provide testing and diagnosis of read only memory devices and systems, and the like, wherein the types or sources of failures are positively identified.

Another object is to provide testing and diagnosis of the type described that is conveniently implemented using programming.

A still further object is to provide functional testing of ROMs and the like that can be applied to circuit boards containing ROMs or to ROM chips directly.

Another object of the invention is to provide functional testing of ROMs and the like wherein no advance knowledge of the contents of the memory or other information such as a signature derived from a known operational memory is required.

A further object is to provide functional testing of ROMs or the like that does not require any manual probing of external leads of the ROM or of external circuitry.

The above and other objects of the invention are satisfied in accordance with one aspect of the invention by providing a method of and apparatus for testing ROMs and the like, wherein the memory is hypothesized to be faulty and ROM data are searched for patterns that disprove the hypothesis by counterexample. Thus, the method of the invention is carried out by addressing different storage locations within the memory, determining any relationships between stored in different memory locations that could not exist if the memory is defective, and based on the absence of those relationships, identifying particular faults.

Pathological cases, i.e., data patterns stored in the memory (for example, all 1's or all 0's stored in "empty" regions of the memory) that would misdiagnose a good memory as faulty, are determined in advance and the search modified by data masking to remove them from consideration.

Particular faults, viz., stuck or tied data or address lines are diagnosed and identified in accordance with more particular aspects of the invention. Thus, stuck data lines are tested by making comparison of the $i^{th}$ bit of each word stored in the memory successively with the $i^{th}$ bits of the other words stored in the memory. An $i^{th}$ data line is determined to be not stuck when one of the comparisons indicates that corresponding $i^{th}$ bits of two different words have different logic states. In other words, all data lines are assumed to be stuck, and the assumption is overcome during the test by counterexamples identifying data lines that are capable of attaining different logic states, i.e., "1" and "0".

Tied data lines are tested by making comparisons of an $i^{th}$ bit of a data word stored in the memory successively with the remaining bits j of the same word. That $i^{th}$ and $j^{th}$ data lines are not tied together is determined to exist when one of the comparisons indicates that the $i^{th}$ and $j^{th}$ bits have different logic states. Accordingly, all data lines are assumed initially to be tied together, and this assumption is overcome during the test by counter-examples identifying data line pairs containing data capable of having mutually different logic states.

Stuck address lines are tested by addressing the memory with a first address to obtain a first data word. An $i^{th}$ address bit is complemented to obtain a second address for addressing the memory to obtain a second address for addressing the memory to obtain a second data word. An $i^{th}$ address line is determined to be not stuck when the first and second data words have different values. Thus, all address lines are presumed initially to be stuck, and the presumption is overcome by counterexamples proving that changing an address bit on the address lines, one at a time, addresses different storage cells of the memory.

Tied address lines are tested by setting arbitrarily two different lines $(a_i,a_j)$ of the address lines to different logic states (0,1) to form an address $A_{01}$, then setting said lines to (1,0) to opposite states to form a second address $A_{10}$. First and second data words accessed from the memory at addresses $A_{01}$ and $A_{10}$ are compared, and the address lines $(a_i,a_j)$ are determined to be not tied together when values of said first and second data words are different from each other. In other words, all address lines are initially assumed to be tied together, and the assumption is overcome by counterexamples showing that pairs of the lines are capable of attaining alterable and mutually different logic states.

Because the test is based upon detection of counterexamples, the test for any fault mode terminates as soon as a first counterexample is found. Accordingly, the length of each test, although probabilistic, is usually short.

Apparatus for implementing the test is preferably comprised of microprocessor based circuitry, programmed to operate in the manner described hereinabove.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRRYING OUT THE INVENTION

Figure 1:
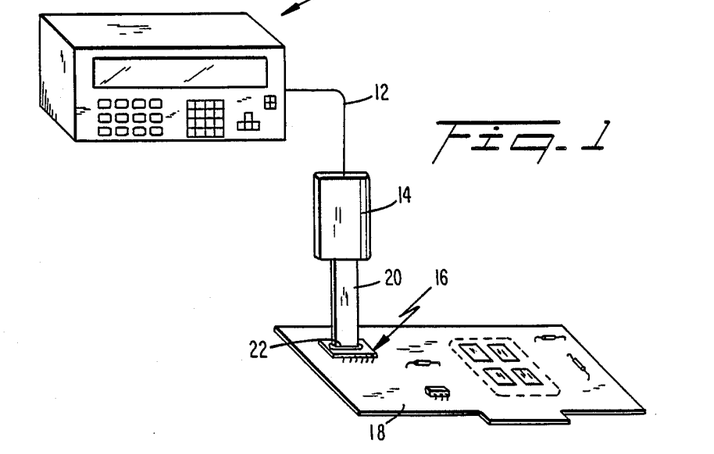
FIG. 1 is a perspective view of apparatus for onboard testing of ROMs, provided in accordance with the principles of the invention.

Referring to FIG. 1, apparatus for testing read-only memory (ROM) and the like systems, in accordance with the invention, comprises a control computer 10 that preferably is panel controllable via manual switches, as shown, programmed to transmit instructions through a cable 12 to an interface pod 14. The pod 14 emulates a bus interface to a ROM circuit 16 to be tested on a circuit board 18, providing addressing control signals to the ROM and retrieving data words therefrom, to be returned to and analyzed by the computer 10. The pod 14 is coupled to the ROM circuit 16 through a ribbon cable 20 and connector clip 22 having a configuration corresponding to that of the ROM circuit under test.

The circuit architecture of the system shown in FIG. 1 comprises a microprocessor 24 (see FIG. 2), contained within control computer 10, that in turn is controlled by a program ROM 26 that contains firmware for carrying out the functions described hereinafter, together with a data pattern random access memory (RAM) 28 for storing data patterns read from the ROM 16 under test. Data and address registers 30, 32 contained within interface pod 14 store respectively data and addresses read from and supplied to the ROM 16, and a status indicator 34 indicates when the test is completed.

Figure 2:
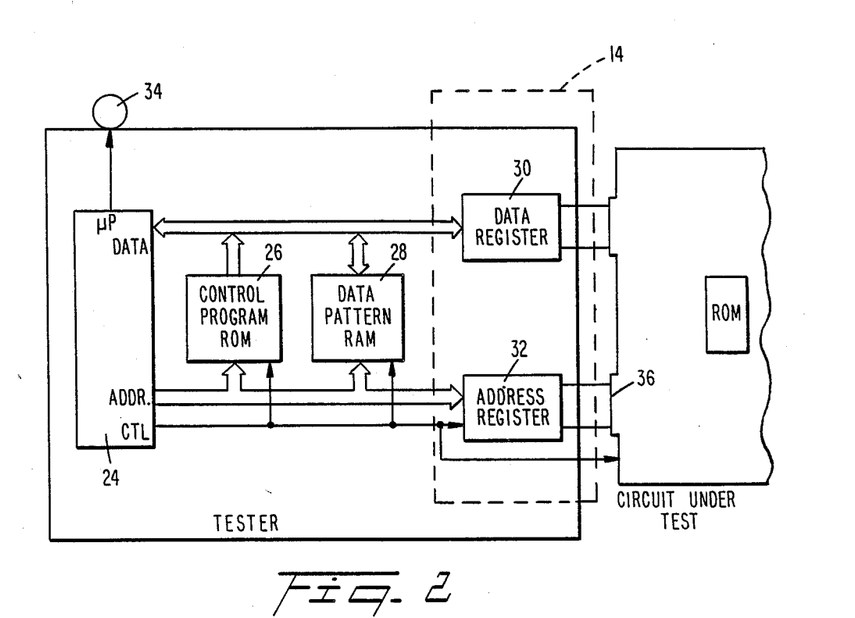
FIG. 2 is a circuit block diagram of microprocessor based circuitry for carrying out the invention in accordance with the preferred embodiment.

More particularly, the program stored in ROM 26 directs the microprocessor 24 to write addresses into the address latch or register 32. Address signals from the latch 32 in turn are connected to the circuit board 18 containing ROM 16 under test, through an edge connector 36, or through a clip lead 22 shown in FIG. 1, to be transferred to the data pattern memory 28. The control program directs the sequence of addresses presented to ROM 16 under test, as well as directs the analysis of data values returned. Optionally, the microprocessor 24 also is programmed to verify that its own ROM 26 is fault free, by executing the same tests described hereinafter on the control program ROM 26.

Types of faults that are likely to occur in ROM systems include faults classified as "internal" faults and those classified as "external" faults. Internal faults are defined as faults within the ROM chip itself, such as internal data lines; external faults are those within circuitry for accessing the chip, e.g., address lines. For each type of fault, testing in accordance with the invention analyzes data contained in the ROM for relationships that could not exist if the ROM were faulty, proving that the ROM is functioning correctly. If not counterexample to some fault hypotheses can be found, the ROM is assumed to contain a fault of the hypothesized type.

Figure 3A:
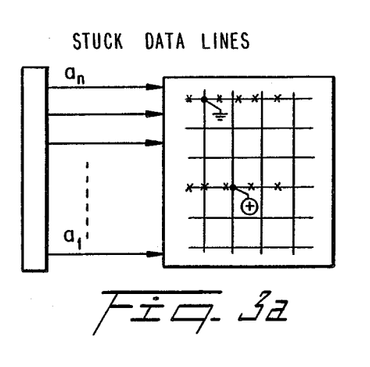
FIGS. 3(a)-(d) are diagrams for describing different fault modes of ROMs tested in accordance with the invention.
Figure 3B:
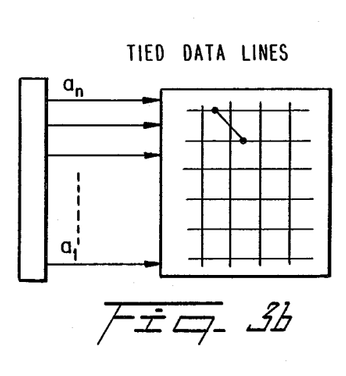
Figure 3C:
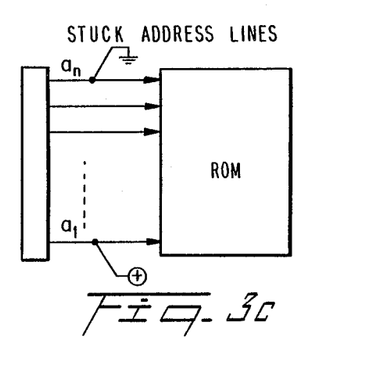

Although many types of faults can be tested using the principles of this invention, particular types of faults tested in accordance with the preferred embodiment of the invention are stuck data lines, tied data lines, stuck address lines and tied address lines. Stuck data lines, shown in FIG. 3(a) are lines within the ROM circuit, for accessing data storage locations therein (one line per bit) that are tied permanently either high (logic 1) or low (logic 0) or open-circuit, so that the ROM "sees" them as stuck in one logic state. Accordingly, the logic state of a stuck data line cannot be changed so that the logic state attained by the data line is independent of the corresponding data bit within an addressed location. Tied data lines, shown in FIG. 3(b), are data lines that are tied together, so that they cannot have different logic states independently of the bit contents of the data words addressed. Accordingly, the two data lines, tied together in the Figure, can have the states (0,0) or (1,1) but never (0,1) or (1,0). Stuck address lines, shown in FIG. 3(c), are stuck at a logic 1 or logic 0, or open circuit so that regions of the ROM cannot be addressed, i.e., there is an unintentional masking of data. In the example shown, the most significant address line $a_n$ is tied to ground (logic 0) whereas the least significant line $a_n$ is tied to the supply source (logic 1)). Data stored in ROM locations that must be addressed using an address 0, $a_2$, $a_3 \ldots a_n$ or $a_1$, $a_2$, $a_3 \ldots 1$, or a combination thereof, accordingly cannot be accessed.

Figure 3D:
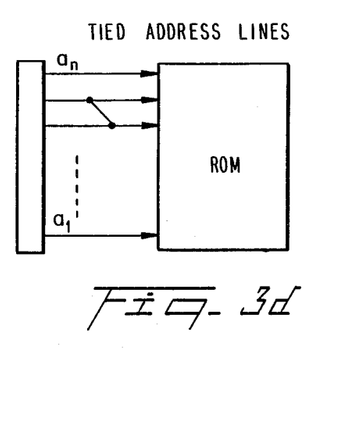

Tied address lines, shown in FIG. 3(d), similarly provide unintentional masking of the ROM by preventing data that require tied address lines having different bits from being accessed. Thus, in the example shown, storage locations of ROM having addresses $a_1$, $a_2$, $a_3 \ldots 1,0$, $a_n$ or a, $a_2$, $a_3 \ldots 0,1$, $a_n$ cannot be accessed because addresses lines $A_2$ and $A_3$ cannot be driven to opposite states. The conditions underlying the fault modes shown in FIGS. 3(a)-(d) shall be considered hereinafter in more detail in connection the preferred embodiment.

Figure 4:
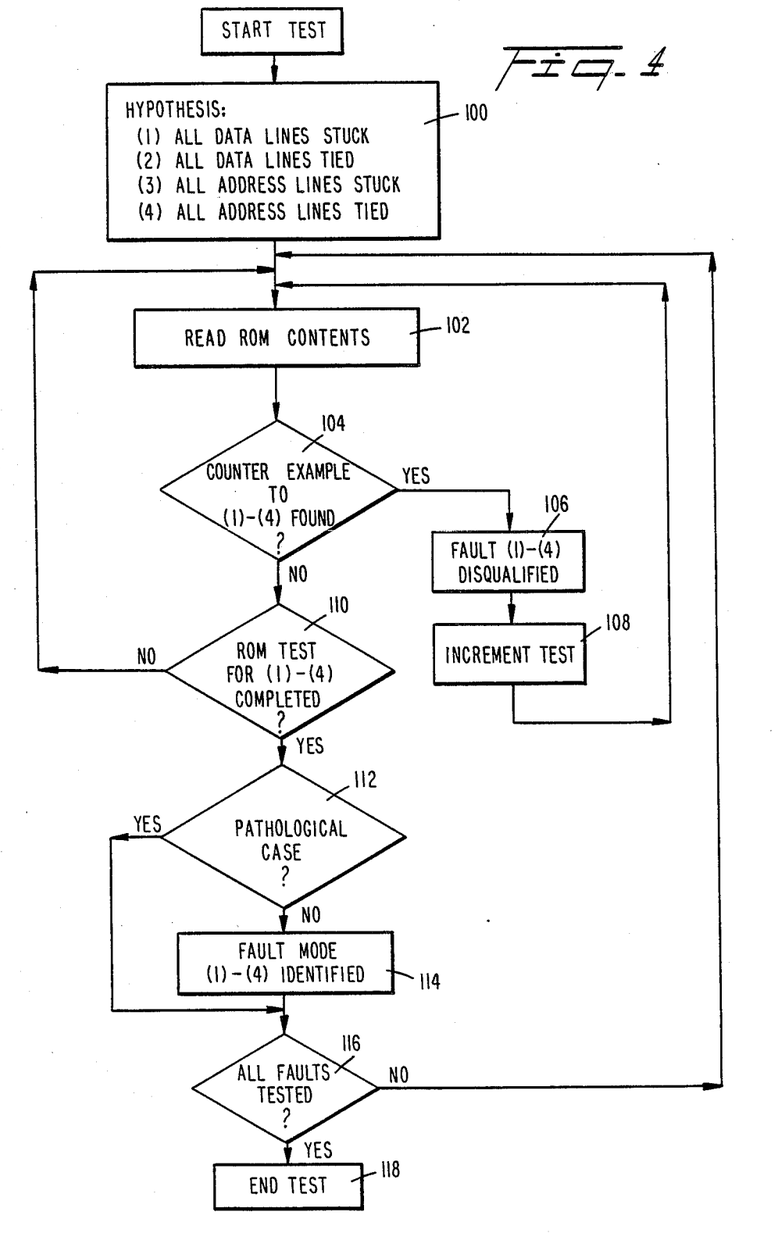
FIG. 4 is a flowchart showing basic methodology of the invention.

Referring now the flow chart of FIG. 4, showing conceptually the method of detecting and diagnosing faults in ROM and the like systems, implemented in accordance with the invention, it is initially hypothesized that all data and address lines of the ROM or the like are both stuck and tied (step 100), and the contents of the memory are accessed to determine whether any counterexamples to the hypothesis exist (steps 102 and 104), i.e., whether any conditions are found that could not exist if the memory is faulty in the manner hypothesized. Counterexamples for each data line and address line with respect to each fault mode hypothesized are stored, accumulated and tested to determine whether all lines are free of all faults. Whenever a counterexample is found, the associated fault and lines involved are disqualified (step 106) and the test is incremented to test other lines and fault modes (step 108) so that the contents of the memory are again addressed under the next set of programmed conditions.

On the other hand, if no counterexample is found in step 104, whether all data and address lines have been tested for the particular mode of fault now under test is determined, and the program advances to step 112 which filters the result for pathological cases, i.e., for memory having contents that will test faulty but wherein the memories are known to be functioning correctly. If there is no pathological case, the particular fault mode (1)-(4) is identified in step 114; otherwise, step 114 is bypassed.

In step 116, it is determined whether all fault modes have been tested. If so, the test ends (step 118), and an end of test display indicator is energized; otherwise, the program loops back to step 102.

Of significant importance, the methodology described in FIG. 4 in accordance with the invention is fast, although the running time of each test executed is probabilistic. The test may terminate after reading just a few ROM locations if the ROM is programmed with fortunate values. This is because each line or pair of lines is disqualified as a candidate for a particular fault mode as soon as the first counterexample for that fault mode is found. The particular number of read operations performed depends on the data programmed into the ROM.

As a practical matter, the data contained in an ROM is arbitrary but not random. If the contents of the ROM were truly random, the probability that data bit I of a word D is in a particular state is 0.5 and the state of any data bit would be independent of all other data bits. However, in practice, not only do certain words stored in a typical ROM occur with greater frequency, but data in consecutive locations are somewhat correlated. Thus, if we assume that certain data words occur with higher frequency that others, as is common with instruction ROMs, ASCII data, etc., data bit i is 1 with probability $P_i$ and 0 with probability $(1-P_i)$.

The correlation of consecutive locations in the ROM can be overcome by probing the ROM at random. In practice, however, memory storage locations that differ in one address bit, that is, by a power of 2, are probed in accordance with one aspect of the invention. Pathological cases are listed, and an informal argument given that pathological ROM contents do not occur in those uses typically made of ROMs.

Particular tets are now described with reference to the flow chart of FIGS. 5(a)-(d).

Figures 5A, 5B:
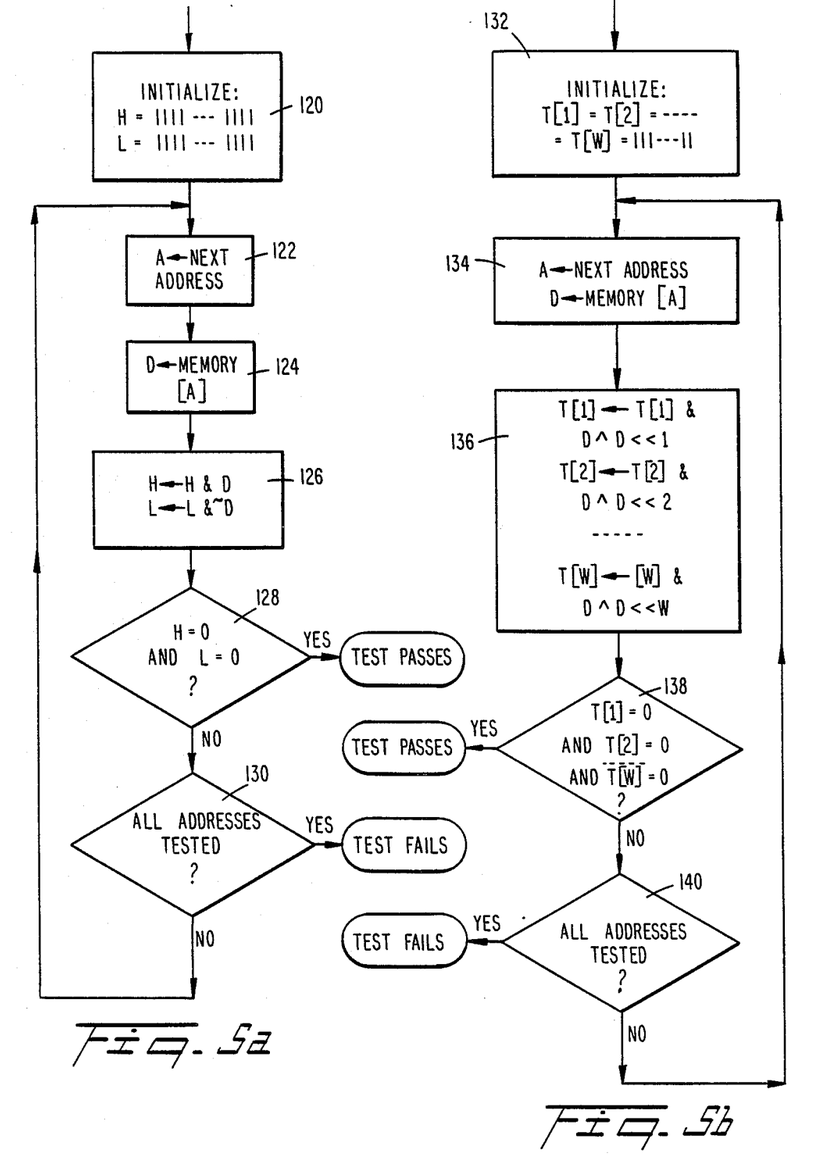
FIGS. 5(a)-(d) are flowcharts of programming for testing stuck and tied data lines and stuck and tied address lines, respectively.
Figure 5C:
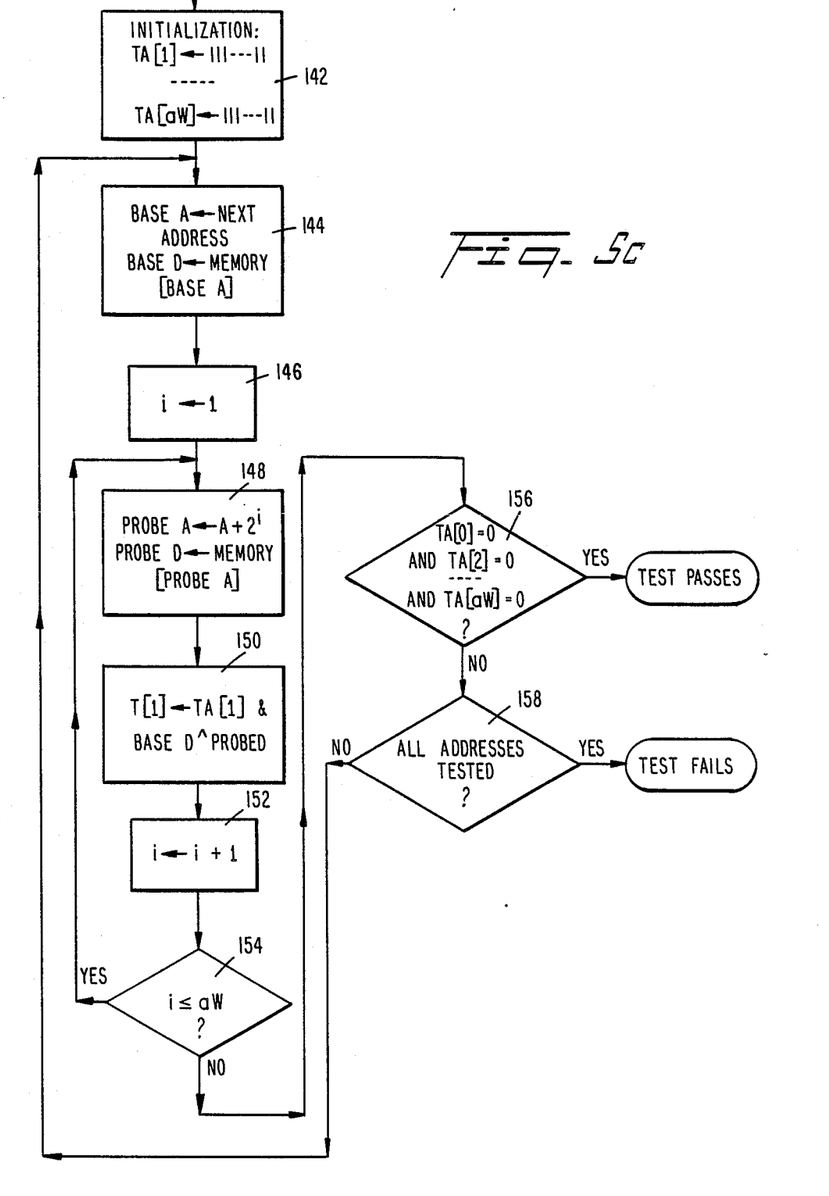
Figure 5D:
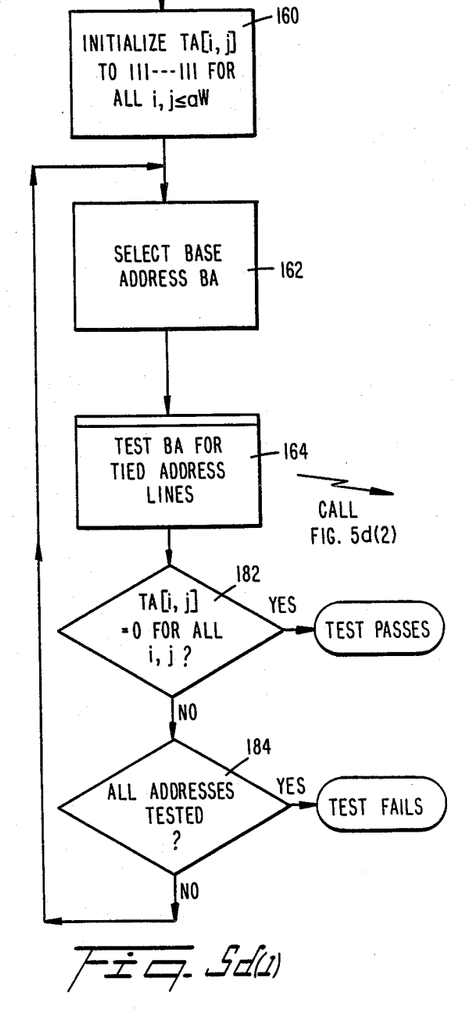

Referring first to FIG. 5(a), programming for diagnosing and identifying stuck data lines initializes two variables H and L to all ones, as shown in step 120. This initialization is the expression of the hypothesis that all data lines are stuck high (H) and all data lines are stuck low (L), a condition that is, of course, physically impossible to exist. The next memory location of the ROM is addressed (step 122) and data stored therein are read (step 124). The content of variable H (now all ones) is logically ANDed with the content D of the memory location addressed, and the result replaces the original value of H. Similarly, the value of variable L (initially all ones) is logically ANDed with the complement of the content D, and the result replaces the value of L (step 126). Any zero bits in word D represent lines that are low, so that they cannot be tied high. Accordingly, each zero bit indeed represents a counterexample to the hypothesis that all data lines are high. When all bits in word D are zero, accumulated in variable H it follows that none of the data lines are stuck high.

Similarly, zero bits in complement D represent data lines that are high. Accordingly, those bits are counterexamples to the hypothesis that all data lines are stuck low. As each counterexample is detected by a zero bit in complement D, it is accumulated in variable L, so that when all bits in complement D are zero it follows that none of the data lines are stuck low.

All data lines are considered to be not stuck high or low when all bits of H and L are zero (step 128). The test accordingly "passes", i.e., no data lines are tied high or low, as soon as H=0 and L=0 (step 128). The test is deemed to have "failed" if all addresses are tested (step 130) and some line is marked as tied high or tied low.

Although it is possible, statistically, that a relatively large number of addresses will have to be tested before all data lines are determined to be not stuck, it should be appreciated that the test of each data line will terminate early, as soon as it is determined that the data line under test is not stuck and the test of all data lines terminates when it is determined that all data lines are not stuck. Thus, for a fault-free ROM, the test terminates rapidly since it runs only until it finds a 1 or a 0 in each data bit. This is a result of the probabalistic characteristic of the test.

The test can in practice terminate after reading as few as two ROM locations if the second location probed contains the complement of the data read in the first.

The test for a data line i stuck is not affected by faults affecting other data bits, so that a stuck data bit is found when other stuck or tied data bits are present. It can be shown mathematically that for random data stored in the ROM, the test terminates after eight probes more than 99% of the time.

Figure 6:
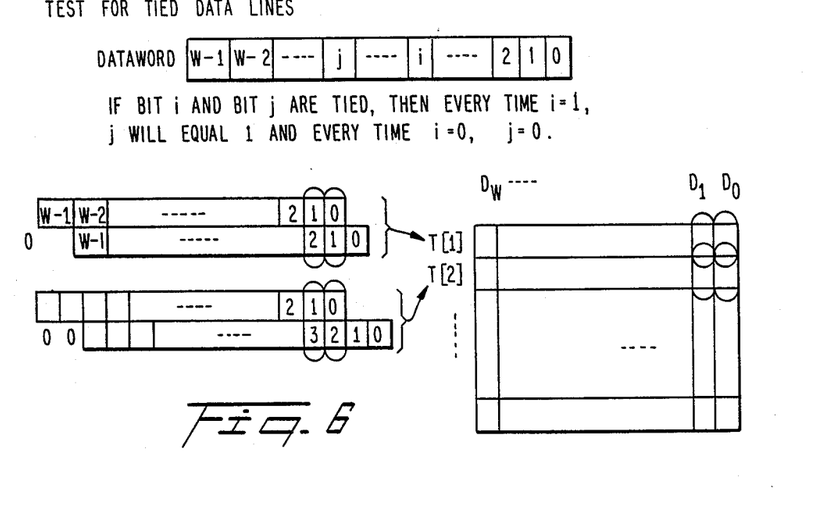
FIG. 6 is a diagram useful for explaining testing for tied data lines.

The test for tied data lines shall now be described in detail with reference to the flowchart of FIG. 5(b). However, reference is first made to the FIG. 6, which shows a data word 0,1,2 ... i ... j ... (w−1). Within an array of data words T, terminology used in the flowchart of FIG. 5(b) is as follows. The content of T[1] indicates whether a data bit may be tied to its immediate neighbor; T[k] indicates whether a data bit may be tied to the bit k places over. Examples for T[1] and T[2], with data words shifted one place and two places, respectively, are shown in FIG. 6.

Step 132 in FIG. 5(b) initializes all T[k] to be all 1's, thereby presenting the hypothesis that all bits are tied to all of their neighbors. Data word T[k] is addressed at a location, which may be arbitrary, and the contents are read (step 134). When $T[k]_i$ is 0 for $1 \leq k \leq (w-1)$, bit $d_i$ is known to not be tied to any other bit. Accordingly, logically ORing the words of T[k] together reveals data bits which ae tied to some other bit. T[k] is ANDed with D EXCLUSIVE ORed with itself shifted by k bits, for each probed location D(A) in the ROM (step 136). The test terminates when T[k] is all 0's (step 138) or when the ROM is completely examined (step 140).

When a ROM is known to contain pathological data, the test is altered to exclude consideration of certain data bits. A mask the width of the data word is provided with a bit set for each data bit whose contents are pathological.

Fault conditions observed in this bit are not reported. If b data bits contain pathological contents, b−1 data bits must be excluded. This mask can be combined with the mask used to denote pathological behavior of the stuck data bit test.

The test for stuck address lines is based on the property that if an address bit is stuck, it is not effective in addressing the ROM. Thus, if an address bit $A_i$ is stuck, locations D(A) and $D(A^\wedge 2^i)$ have the same value, where the symbol "$^\wedge$" is an exclusive-OR operation and $D(A^\wedge 2^i)$ is the content of D(A) with bit i complemented. If D(A) differs from $D(A^\wedge 2^i)$, then $a_i$ cannot be stuck. Because a ROM circuit may access several ROMs to establish a data word, it is necessary to maintain a separate record of each data bit addressed to ensure that all ROMs in the circuit are tested. In accordance with the invention, the test employs a "w" element array T, wherein $T[i]_j$ is 1 if $a_i$ still appears to be stuck for the jth bit of the data word. Initially, every element of T is set to 1 (step 142 of FIG. 5(c)). For every address A probed (step 144) beginning with bit 1 of the address (step 146), T[i] is replaced by $T_i[i]$ AND the complement of D(A) exclusive-OR'd with $D(A^\wedge 2^i)$, the data at another location having an address differing by a single bit (steps 148–154). The exclusive OR function detects any differences in content between the two words accessed, and any 0's, indicating that a data line cannot be stuck or accumulated at T until either all address bits are determined to be not stuck (step 156) or all addresses are tested (step 158).

A pathological dase occurs if the contents of the ROM are duplicated in such a way that for some $a_i$, the contents of D(A) and $D(A^\wedge 2^i)$ are always the same. This, of course, is unlikely.

In the presence of stuck data lines, address lines will appear to be stuck for that data bit. The presence of a stuck data line therefore masks the presence of a stuck address line for that data bit.

Figures 7A, 7B:
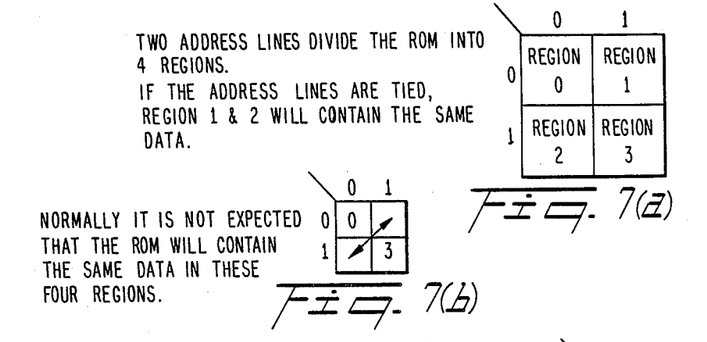
FIG. 7 is a diagram useful for explaining testing for tied address lines.

Tied address lines are tested in accordance with the flowchart of FIGS. 5(d)(1) and 5(d)(2). The test is based upon the hypothesis that two address lines $A_i$ and $A_j$ divide a ROM into four regions corresponding to four possible states (0,0), (0,1), (1,0) and (1,1) of $a_i$ and $a_j$. If $a_i$ and $a_j$ are tied together, they cannot be driven to opposite states. In other words, if 1 is presented on $a_i$ and 0 is present on $a_j$, some indeterminant value will be read by the ROM, and this value will be the same for both $a_i$ and $a_j$. This condition is shown in FIG. 7(a), wherein a pair of tied address lines divides the memory into regions 0, 1, 2 and 3. Because the pair of address lines are tied, regions 1 and 2 will contain the same data, as shown by the arrow in FIG. 7(b). Accordingly, one of the regions 1 or 2 is unintentionally masked. Whether the value of $a_i$ and $a_j$ is interpreted as a 1 or as a 0 is not important. What is important is that the (0,1) and (1,0) states of $a_i$ and $a_j$ cannot exist. Accordingly, for some base address A, if $A_{01}$ is the address obtained from A by setting $a_i$ to 0 and $a_j$ to 1, and $A_{10}$ is the address obtained from A by setting $a_i$ to 1 and $a_j$ to 0, than if $D(A_{01})$ differs from $D(A_{10})$ and some data bit, $a_i$ and $a_j$ cannot be tied in that data bit.

In accordance with the flowchart of FIG. 5(d)(1) and 5(d)(2) a square array T records tied address lines. $T[i,j]_k$ is 1 if $a_i$ and $a_j$ may be tied in data bit k. In accordance with hypothesis, T is initially set to all 1's to presume that all address lines are tied to all others. For each probe address A, beginning with a base address BA (step 162), the base address is tested to determine whether it contains any address lines that are not tied (step 164) by setting T[i,j] to T[i,j] AND compliment $(D(A_{01})^\wedge D(A_{10}))$ in accordance with the algorithm of steps 166–180 of FIG. 5(d)(2). When T[i,j] is 0, $a_i$ is not tied to $a_j$; when T[i,j] is 0, for $i+1<=j<=n$, $a_i$ is not tied at any other address bit, whereby OR'ing the words of T together (step 178) reveals the address bits which are not tied to any other bits. The test terminates when all address lines are determined to be not tied (step 182) or that all addresses have been tested (step 184).

Figure 7C:
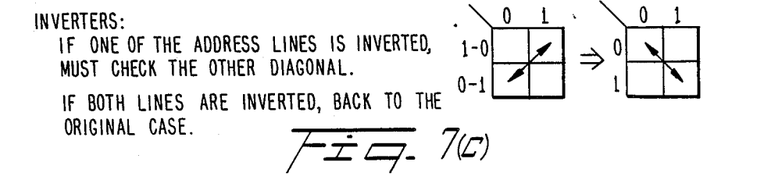

It is possible that some address bits are inverted with respect to other address bits between the ROM circuit and the test point, as is typical with address bit buffering schemes in use. If this occurs, the test must also verify the (00) and (11) states of $a_i$ and $a_j$. Since the portion of T actually used by the test is only the upper right triangle portion, as shown in FIG. 7(c), the lower triangle portion is used for the non-inverted case.

Programming for carrying out the invention in TL/1 programming language is shown in Appendix I.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

APPENDIX I

```
program DiagROM (addr, upto, data_mask, addr_mask, probes)

declare ! formal arguments
    numeric addr
    numeric upto
    numeric data_mask = 0
    numeric addr_mask = 0
    numeric probes   = 20.
  end declare declare ! local variables
    numeric probeA
    numeric probeD
    numeric nwords
    numeric p
    numeric more_addr
    numeric more_data
    numeric array [0:31.,1:2]  TD
    numeric array [0:31.,0:31.] TA
  end declare declare ! global variables
    global numeric array [0:31.] dist1
    global numeric dist1_Valid
  end declare function ROM1(a,b)
    declare ! formal parameters
      numeric a ! address
      numeric b ! bit
    end declare declare ! global variables
      global numeric array [0:31.] dist1 ! Cached data
      global numeric dist1_Valid    ! Data in dist1 valid flag
    end declare if (dist1_Valid & setbit b) = 0 then
      dist1[b] = read addr a ^ setbit b
      dist1_Valid = dist1_Valid | setbit b
    end if
    return dist1[b]
  end function ! Preliminary definitions and checks.

if addr >= upto then fault DiagROM 'illegal arguments'
  nwords = upto - addr + 1
  if probes = 0 then probes = nwords
  if addr_mask = 0 then addr_mask = setbit (nwords) - 1
```

APPENDIX I (CONT'D)

```
! initialization more_data = data_mask
  more_addr = data_mask
  loop for i = 0 to msb data_mask
      TD[i,1] = data_mask
      TD[i,2] = data_mask
      loop for j = 0 to msb addr_mask
          TA[i,j] = data_mask
      end loop
  end loop ! Let's boogie loop for p = 1 to probes
      if more_data = 0 and more_addr = 0 then return ! success
      probeA = addr + (random() & addr_mask)
      probeD = read addr probeA
      if more_data then ! test for data bits stuck or tied
         TD[0,1] = TD[0,1] &  (probeD)
         TD[0,2] = TD[0,2] & ~(probeD)
         more_data = (TD[0,1] | TD[0,2])

loop for i = 1 to msb data_mask
             TD[i,1] = TD[i,1] &  (probeD ^ (probeD << i))
             TD[i,2] = TD[i,2] & ~(probeD ^ (probeD << i))
             more_data = more_data | (TD[i,1] | TD[i,2])
         end loop
      end if if more_addr then ! test for address bits stuck or tied
         dist1_Valid = 0
         more_addr = 0
         loop for i = 0 to msb addr_mask
             if (addr_mask & setbit i) <> 0 and TA[i,i] <> 0 then
                TA[i,i] = TA[i,i] & ~(probeD ^ ROM1(probeA, i))
                more_addr = more_addr | TA[i,i]
             end if
             loop for j = i+1 to msb addr_mask
                 if (addr_mask & setbit i) <> 0 and (addr_mask & setbit j) <> 0 then
                    if ((probeA & setbit i) = 0) = ((probeA & setbit j) = 0) then
                       if TA[i,j] then TA[i,j] = TA[i,j] & ~(ROM1(probeA,i) ^ ROM1(probeA,j))
                       if TA[j,i] then TA[j,i] = TA[j,i] & ~(probeD ^ read(probeA ^ (setbit i) ^ (setbit j)))
                    else
                       if TA[i,j] then TA[i,j] = TA[i,j] & ~(probeD ^ read(probeA ^ (setbit i) ^ (setbit j)))
                       if TA[j,i] then TA[j,i] = TA[j,i] & ~(ROM1(probeA,i) ^ ROM1(probeA,j))
                    end if
                    more_addr = more_addr | (TA[i,j] | TA[j,i])
                 end if
             end loop
         end loop
      end if
  end loop
```

APPENDIX I (CONT'D)

```
! diagnostic results if more_data then
    loop for i = 0 to msb data_mask
        loop for j = i+1 to msb data_mask
            if (data_mask & setbit i) <> 0 and (data_mask & setbit j) <> 0 then
                if ((TD[i,1] | TD[i,2]) & setbit j) <> 0 then
                    if i = 0 then
                        fault 'ROM data stuck' bit j
                    else
                        fault 'ROM data tied' bit j-i, tied_to j
                    end if
                end if
            end if
        end loop
    end loop
else if more_addr then
    loop for i = 0 to msb addr_mask
        loop for j = i to msb addr_mask
            if (addr_mask & setbit i) <> 0 and (addr_mask & setbit j) <> 0 then
                if TA[i,j] | TA[j,i] then
                    if i = j then
                        fault 'ROM address stuck' bit i, datamask TA[i,i]
                    else
                        fault 'ROM address tied' bit i, tied_to j, datamask TA[i,j] | TA[j,i]
                    end if
                end if
            end if
        end loop
    end loop
end if end program
```

What is claimed is:

1. A method of testing and diagnosing faults in a memory having data prestored therein, comprising the steps of assuming initially that said memory is defective; addressing different storage locations within said memory; detecting any relationships between data stored in different memory locations which disproves said assumption; and based on said relationships, identifying particular faults.

2. The method of claim 1, including testing the memory for stuck data lines by making comparisons of the $i^{th}$ bit of selected words stored in said memory successively with the $i^{th}$ bit of other selected words stored in said memory; and determining that an $i^{th}$ data line is not stuck when one of said comparisons indicates that corresponding $i^{th}$ bits of two different words have different logic states.

3. The method of claim 1, including testing the memory for tied data lines by making comparisons of an $i^{th}$ bit of a data word stored in said memory successively with the remaining bits j of the same word; and determining that $i^{th}$ and $j^{th}$ data lines are not tied when one of said comparisons indicates that said $i^{th}$ and $j^{th}$ bits have different logic states.

4. The method of claim 3, including the steps of (a) setting all bits of a (w−1) element array to binary one; (b) probing addresses of said memory; (c) determining the contents of successive addresses probed; (d) for each address probed, comparing each bit of the contents with each of its k'th neighbor bits for $1 \leq k \leq (w-1)$ (by exclusive-ORing the contents with a complimented copy of the contents that has been shifted k bits); (e) ANDing each of the (w−1) results of the foregoing step into the corresponding k'th element of the array; (f) comparing the (w−1) words of the array against binary zero; and (g) terminating the test if the (w−1) words are all binary zero or if all addresses in said memory have been probed.

5. The method of claim 1, including testing the memory for stuck address lines by addressing the memory with a first address to obtain a first data word, complementing an $i^{th}$ address bit to obtain a second address, addressing the memory to obtain a second data word and determining that an $i^{th}$ address line is not stuck when the first and second data words have different values.

6. The method of claim 1, including testing the memory for tied address lines i and j by selecting a base address A, then forming two additional addresses $A_{10}$ and $A_{01}$ by complementing the i'th address bit of A (for $A_{10}$) and the j'th address bit of A (for $A_{01}$), obtaining first and second data words from said memory at addresses $A_{10}$ and $A_{01}$ respectively; comparing said first and second data words and determining that said address lines are not tied when values of said first and second data words are different from each other.

7. The method of claim 6, including (a) setting all bits of a square array to binary one; (b) forming base addresses of said memory; (c) selecting pairs of address bits i and j such that $0 \leq i \leq j \leq aw$; (d) for each pair of address bits i and j forming the addresses $A_{10}$ and $A_{01}$ and determining the contents of said addresses; (e) for each pair of addresses probed, exclusive-ORing the contents of said addresses; (f) complementing the result of step (e); (g) ANDing the result of step (f) with the array A[i,j]; (h) comparing the words of the array against binary zero; and (i) terminating the test if the tested words are all binary zero or if all addresses in said memory having been probed.

8. A method of testing and diagnosing faults in a memory having data prestored therein, comprising the steps of masking pathological data stored in said memory; addressing different storage locations within said memory; detecting any relationships between data stored in different memory locations that could not exist if the memory is defective; and based on said relationships, identifying particular faults.

9. A method of testing and diagnosing faults in a memory having data restored therein, comprising the steps of addressing different storage locations within said memory; detecting any relationships between data stored in different memory locations that could not exist if the memory is defective; and based on said relationships, identifying particular faults; testing said memory for stuck data lines by making comparisons of the $i^{th}$ bit of each word stored in said memory successively with the $i^{th}$ bits of the other words stored in said memory; and determining that an $i^{th}$ data line is not stuck when one of said comparisons indicates that corresponding $i^{th}$ bits of two different words have different logic states; and (a) setting all bits of first and second variables to binary one; (b) probing addresses of said memory; (c) determining the contents of successive addresses probed; (d) for each address probed, ANDing said contents with said first variable and ANDing complements of said contents with said second variable to obtain modified first and second variables; (e) comparing the values of the modified first and second variables to binary zero; and (f) terminating the test if the values of the modified first and second variables are both binary zero, or if all addresses of said memory have been probed.

10. A method of testing and diagnosing faults in a memory having data restored therein, comprising the steps of addressing different storage locations within said memory; detecting any relationships between data stored in different memory locations that could not exist if the memory is defective; and based on said relationships, identifying particular faults; testing said memory for stuck address lines by addressing said memory with a first address to obtain a first data word, complementing and $i^{th}$ address bit to obtain a second address, addressing said memory to obtain a second data word and determining that an $i^{th}$ address line is not stuck when the first and second data words have different values; and (a) setting all bits of a w element array S to binary one; (b) probing addresses A of said memory; (c) for each address probed, complementing a bit of the address to obtain a modified address, EXCLUSIVE ORing the contents of the address with the contents of the modified address to determine differences in corresponding bit values therebetween; (d) ANDing the result of step (c) with the bits of the array S; (e) comparing the (w) words of the array against binary zero; and (f) terminating the test if the (w) words are all binary zero, or if all addresses in said memory have been probed.

11. An apparatus for testing and diagnosing faults in a memory having data prestored therein, comprising means for addressing different storage locations within the memory; means coupled to said addressing means for assuming initially that said memory is defective and for determining any relationships between data stored in different memory locations which disproves said assumption; and means responsive to said assuming and determining means for identifying particular faults.

12. The apparatus of claim 11, including means for testing the memory for stuck data lines, comprising means for making comparisons of the $i^{th}$ bit of each word stored in said memory successively with the $i^{th}$ bits of the other words stored in said memory; and means for determining that an $i^{th}$ data line is not stuck when one of said comparisons indicates that corresponding $i^{th}$ bits of two different words have different logic stages.

13. The apparatus of claim 11, including means for testing the memory for tied data lines, comprising means for making comparisons of an $i^{th}$ bit of a data word stored in said memory successively with the remaining bits j of the same word; and means for determining that $i^{th}$ and $j^{th}$ data lines are not tied when one of said comparisons indicates that said $i^{th}$ and $j^{th}$ bits have different logic states.

14. The apparatus of claim 11, including means for testing the memory for stuck address lines, comprising means for addressing the memory with a first address to obtain a first data word, means for complementing an $i^{th}$ address bit to obtain a second address, addressing the memory to obtain a second data word and means for determining that an $i^{th}$ address line is not stuck when the first and second data words have different values.

15. The apparatus of claim 11, including means for testing the memory for tied address lines, comprising means for setting lines $(a_i, a_j)$ of an address A to (0,1) to form an address $A_{01}$; means for setting said lines to (1,0) to form an address $A_{10}$; means for obtaining first and second data words from said memory at addresses $A_{01}$ and $A_{10}$, respectively; means for comparing said first and second data words and means for determining that said address lines are not tied when values of said first and second data words are different from each other.

* * * * *